US006990025B2

(12) United States Patent
Kirihata et al.

(10) Patent No.: US 6,990,025 B2
(45) Date of Patent: Jan. 24, 2006

(54) MULTI-PORT MEMORY ARCHITECTURE

(75) Inventors: Toshiaki Kirihata, Poughkeepsie, NY (US); Hoki Kim, Hopwell Junction, NY (US); Matthew Wordeman, Kula, HI (US)

(73) Assignee: International Business Machines Corporation, Armonk, NY (US)

( * ) Notice: Subject to any disclaimer, the term of this patent is extended or adjusted under 35 U.S.C. 154(b) by 132 days.

(21) Appl. No.: 10/604,994

(22) Filed: Aug. 29, 2003

(65) Prior Publication Data

US 2005/0047218 A1 Mar. 3, 2005

(51) Int. Cl.
*G11C 7/00* (2006.01)

(52) U.S. Cl. .......................... 365/189.07; 365/189.04; 365/207; 365/230.05

(58) Field of Classification Search ........... 365/189.07, 365/189.04, 207, 230.05
See application file for complete search history.

(56) References Cited

U.S. PATENT DOCUMENTS

| | | | |
|---|---|---|---|
| 5,418,750 A | 5/1995 | Shiratake et al. | 365/206 |
| 5,563,834 A | 10/1996 | Longway et al. | 365/203 |
| 5,652,728 A | 7/1997 | Hosotani et al. | 365/210 |
| 6,570,781 B1 | 5/2003 | Lee et al. | 365/63 |
| 6,845,059 B1 | 1/2005 | Wordeman et al. | 365/230.05 |

*Primary Examiner*—Connie C. Yoha
(74) *Attorney, Agent, or Firm*—H. Daniel Schnurmann

(57) ABSTRACT

A multi-port memory architecture utilizing an open bitline configuration for the read bitline is described. The memory is sub-divided into two arrays (A and B) consisting of memory gain cells arranged in a matrix formation, the cells having two general ports or separate read and write ports to enable simultaneous a read and write operation. Each memory array includes a reference wordline coupled to reference cells. When the reference cell is accessed, the read bitline (RBL) discharges to a level at half the value taken by a cell storing a 0 or 1. Each pair of RBLB in the same column of the two arrays is coupled to a differential sense amplifier, and each write bitline (WBL) in the two arrays is linked to write drivers WBLs in the two arrays are driven to the same voltage and at the same slew rate. The WBL swing in each array creates coupling noise by the bitline-to-bitline capacitors. For a given sense amplifier and its associated RBLs, the coupling creates an identical coupling noise on RBLA and RBLB that are positioned in the two arrays A and B. This common mode noise is rejected by the differential sense amplifier. Thus, a read sense amplifier can accurately discriminate between the signal by activating the cell by way of RWL, and the reference cell by way of REFWL.

18 Claims, 8 Drawing Sheets

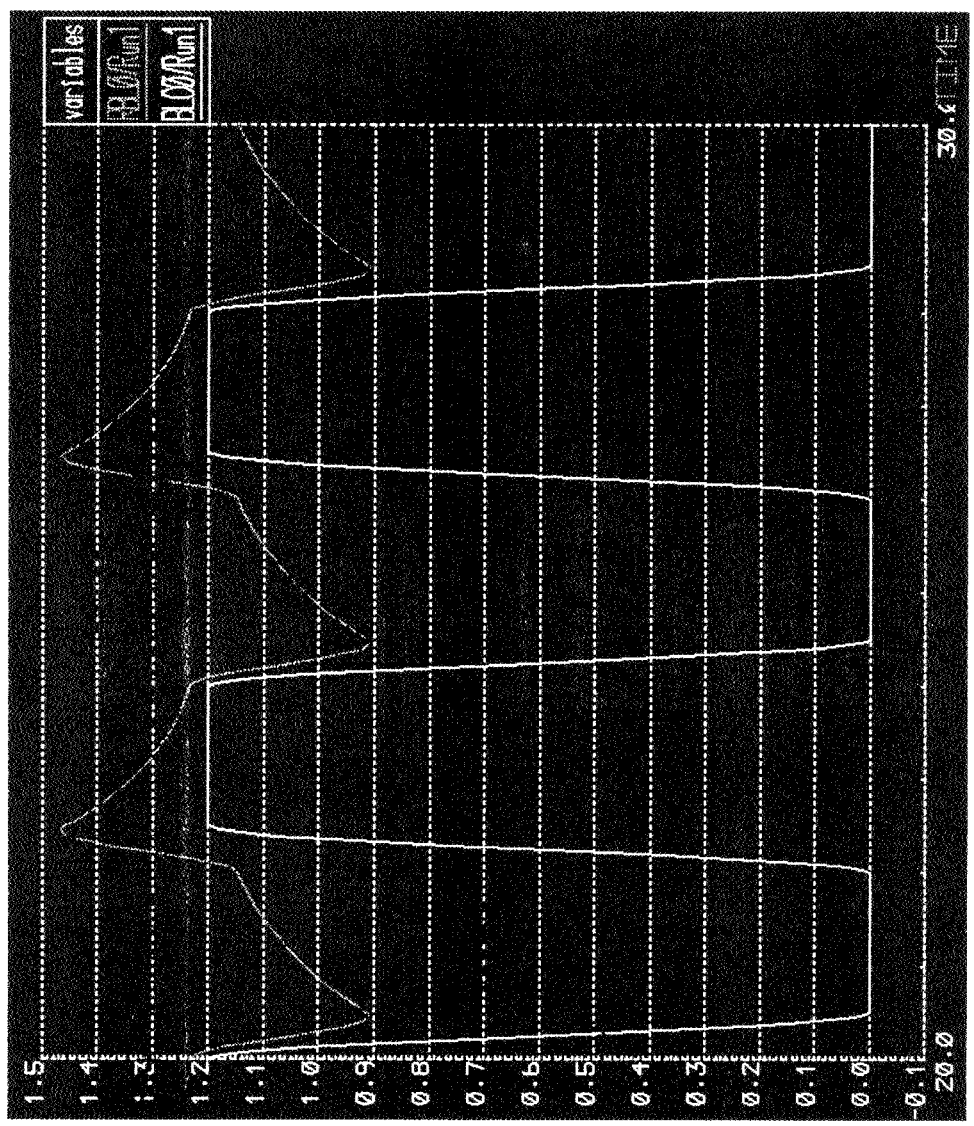
Fig. 5 (PRIOR ART)
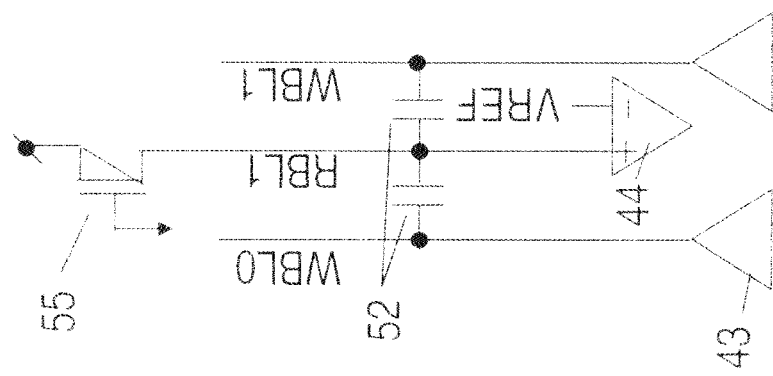

MULTI-PORT MEMORY ARCHITECTURE

BACKGROUND OF INVENTION

This invention describes the architecture of a multi-port memory, and more particularly, it describes a method and configuration to reduce the noise on read bitlines created during a simultaneous read and write operation in a multi-port memory.

Single port memories allow either one read or one write operation during each cycle. Typically, a single port memory consists of either six transistor static memory cells (6T SRAM) or single transistor dynamic cells (1T).

FIG. 1A shows a transistor level schematic of a typical 6T SRAM cell 0. It consists of four NMOS transistors 1, 2, 5, and 6, and two PMOS transistors 3 and 4. PMOS 3 and 4 and NMOS 5 and 6 transistors configure a CMOS cross-coupled latch, which maintains a data bit as a storage element. NMOS 1 and 2 couple nodes 7 and 8 to biltlines BL and bBL when a wordline WL is activated. This allows the data bit to be read to or written from bitlines BL and bBL.

FIG. 1B depicts a transistor level schematic of a dynamic memory cell 10. It consists of one NMOS transistor 11 and one capacitor 12 (1T DRAM cell). When the wordline WL is activated, NMOS 11 couples capacitor 12 to the bitline BL. This allows a data bit stored in capacitor 12 to be read to or written from bitline BL. Regardless whether a 6T SRAM or a 1T SRAM are used, only one WL per array can be activated at a time to perform a read or a write. Activating more than one WL creates a conflict on the common BL.

In order to improve the array utilization as well as the overall data bandwidth, a dual port memory cell and array are used to allow simultaneous access to cells on two wordlines of the same array. A subset of the true dual port memory is one that allows concurrent read and writes to cells on two different wordlines of the same array.

FIG. 2A shows a transistor level schematic for a conventional dual port static memory cell. It consists of four NMOS transistors 1A,1B,5, and 6, and two PMOS transistors 3 and 4. Unlike the 1-port SRAM cell, the gates of the NMOS switching transistors 1A and 1B couple different wordlines WL0 and WL1. By activating both WL0 and WL1, the memory cell coupling WL0 and the memory cell coupling WL1 can be simultaneously read or written through BL0 and BL1 without creating data contention.

FIG. 2B illustrates a transistor level schematic of a prior art dual port dynamic memory cell. It consists of two NMOS switching transistors 14A and 14B, and one capacitor 16. Similar to the dual port static memory cell, the gates of NMOS switching transistors 14A and 14B are coupled to different wordlines WL0 and WL1. By activating the two wordlines WL0 and WL1, the memory cell coupled to WL0 and the memory cell linked to WL1 can be simultaneously read or written through BL0 and BL1 without causing data contention.

FIG. 3A shows a transistor level schematic of a conventional 3T gain cell. The cell is provided with two independent ports. However, in contrast with the dual port cells depicted in FIG. 2, the 3T gain cell is provided with one read port and one write port. When write wordline WWL switches to high, NMOS transistor 34 couples storage node 32 to write bitline WBL when a write operation is performed. The storage node 32 is provided with a capacitor 32 to reduce the impact of leakage on the stored data bit. The data bit stored in storage node 32 can be read out to read bitline RBL when a read wordline RWL switches to high. If storage node 32 stands at high, the two NMOS transistors 31 and 33 remain on, discharging read bitline RBL. If the storage node stands at low, the NMOS transistor 33 is cut-off, keeping RBL at the precharged voltage.

FIG. 3B shows a transistor level schematic for a prior art 2T gain cell. Similar to the 3T gain cell, when write wordline WWL switches to high during a write operation, the NMOS transistor 34 will couple storage node 32 to write bitline WBL. Storage node 32 is preferably provided with a capacitor 32 to store the data bit. Unlike the 3T gain cell, the read NMOS switching transistor 31 is eliminated. The source of the NMOS transistor 32 is coupled to read wordline RWL, making it possible to perform a data bit read operation by measuring the NMOS 33 transistor resistance.

In a conventional method, a voltage between RBL and RWL is applied to read the cell. In the unselected state, both RBL and RWL are maintained at high. To read the data bits, RWL switches to low. If the stored data bit is at low, NMOS 33 remains in the off state, maintaining RBL at high. If the stored data bit stands at high, NMOS 33 remains on, forcing RBL switch to low. Both of the 3T gain cell or the 2T gain cell discussed above allow for simultaneous read and write operations.

FIG. 4 shows memory array for the 3T gain cell that allows simultaneous read and write operations. Memory 40 consists of a plurality of 3T gain cells 42 arranged in a matrix formation. While FIG. 4 shows a 3T gain cell, any cell having two general purpose ports or one read and one write port may be used. The memory cells are controlled by their corresponding read wordline RWL, write wordline WWL, read bitline RBL and write bitline WBL. The data bit on RBL is sensed by a corresponding sense amplifier 43. WBL is driven by write driver circuit 44. The memory cells 42A and 42C are placed in the write mode by activating WWL0, while memory cells 42B and 42D are placed in the read mode by activating RWL1, thereby disabling WWL1 and RWL0. The memory cell data bits in cells 42B and 42D are read out to RBL0 and RBL1, and sensed by the corresponding sense amplifiers 43. A typical differential sense amplifier utilizes a reference voltage VREF that allows discriminating between the voltage on RBL corresponding to the case of reading either a 1 or a 0 from the memory cell. The memory cell data bits in the memory cells 42A and 42C are written through WBL0 and WBL1. These bitlines, i.e., WBL0 and WBL1, are driven by the corresponding write bitline drivers 44. Often, RBL and WBL are placed in close proximity in an integrated circuit. When WBL changes voltage, the coupling capacitance between WBL and the nearby RBL causes a voltage disturbance on RBL. This noise on RBL makes it difficult or impossible to accurately sense the data bit that is being read.

FIG. 5 shows a simplified coupling noise model and simulated waveform for RBL and WBL. The analysis assumes that the data bit on RBL1 is sensed by utilizing sense amplifier 43, while the adjacent WBL0 and WBL1 are driven by write drivers 44 during a write operation. It also assumes that the read bitline RBL1 is precharged to power supply voltage VDD through PMOS 55. Assuming that the gain cell stores a low data bit, then, RBL will remain at voltage VDD. However, when the WBLs switch to high or to low, RBL switches to high or low depending on WBL voltage swing due to the coupling capacitor between RBL and WBLs. As shown by way of simulation, the coupling noise may be as large as 250 mV when the WRL swing is 1.2V, even when the PMOS load device is not disabled during the sensing operation. The coupling noise renders simultaneous read and write operations difficult or potentially impossible. In order to circumvent this problem, one may insert additional wires between each WBL and RBL held at virtual ground, effectively shielding the WBL noise. Shielding techniques eliminate the coupling noise, however, at the expense of a significantly increased cell area. The coupling noise between WBL and RBL presents a unique problem that occurs during a simultaneous read and write operation. Conventional BL twisting methods are not applicable to cancel the noise because of the single ended RBL and WBL configuration defining the dual-port cells.

SUMMARY OF INVENTION

Accordingly, it is an object of the present invention to provide a novel multi-port memory made of 2T or 3T gain cells.

It is another object of the invention to provide a method and a memory configuration that overcomes read bitline sensing problems in a multi-port memory device due to adjacent write bitline to the read bitline coupling noise during concurrent read and write operations.

It is yet another object to reduce the coupled noise by employing differential techniques that either cancel the noise, or transform the noise into a common mode disturbance.

These and other objects of the invention are achieved by a memory array that simultaneously reads and writes different addresses of the same memory array that includes: a) a plurality of memory cells arranged in two equally sized arrays, each memory cell having a separate read and write port, wherein each port is coupled to a wordline that activated the memory cells and a bitline that transfers data to or from the memory cells; b) read bitlines and write bitlines respectively connected to a read and write port of each memory cell along a column of each of the arrays; c) read wordlines and write wordlines respectively connected to the read and write ports of each memory cell along a row of each of the arrays; d) a row of differential sense amplifiers wherein one sense amplifier is provided for each column of the array, and wherein each bitline from the first array being respectively attached to a first input terminal of the corresponding differential sense amplifier, each read bitline from the second array being respectively attached to a second input terminal of the corresponding differential sense amplifier; and e) a row of reference cells in each of the two arrays connected to a reference wordline and the read bitlines, wherein when the reference wordline is activated, the read bitline coupled to the activated reference cell discharges to a voltage level that is mid-way the value at which a cell stores a logic 0 and a logic 1.

The invention describes an open read bitline configuration as well as a re-entrant read bitline configuration and a re-entrant write bitline configuration. Each is effective in providing a dense, low noise simultaneous read-write array.

The memory is sub-divided into two arrays of gain cells arranged in a matrix formation, the cells having two general ports or separate read and write ports to enable simultaneous a read and write operation. Each memory array includes a reference wordline coupled to reference cells. When the reference cell is accessed, the read bitline (RBL) discharges to a level at half the value taken by a cell storing a 1 or 0. Each pair of RBLB in the same column of the two arrays is coupled to a differential sense amplifier, and each write bitline (WBL) in the two arrays is linked to write drivers WBLs in the two arrays are driven to the same voltage and at the same slew rate. The WBL swing in each array creates coupling noise by the bitline-to-bitline capacitors. For a given sense amplifier and its associated RBLs, the coupling creates an identical coupling noise on RBLA and RBLB that are positioned in the two arrays A and B. This common mode noise is rejected by the differential sense amplifier. Thus, a read sense amplifier accurately discriminates between the signal by activating the cell by way of RWL, and the reference cell by way of REFWL.

BRIEF DESCRIPTION OF DRAWINGS

The accompanying drawings, which are incorporated in and which constitute part of the specification, illustrate presently preferred embodiments of the invention and, together with the general description given above and the detailed description of the preferred embodiments given below, they serve to explain the principles of the invention.

FIG. 5 shows a coupling noise model and simulated wave-form applicable to a simplified read bitline RBL and write bitline WBL.

DETAILED DESCRIPTION

Figure 1B:
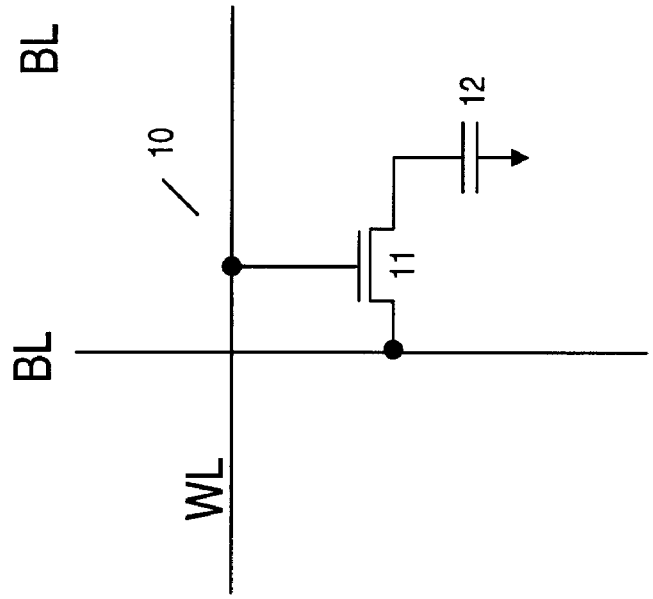
FIGS. 1A and 1B, respectively show a transistor level schematic of a conventional 6T SRAM cell, consisting of four NMOS and two PMOS transistors and Dynamic memory cell consisting of one NMOS transistor and one capacitor.
Figure 1A:
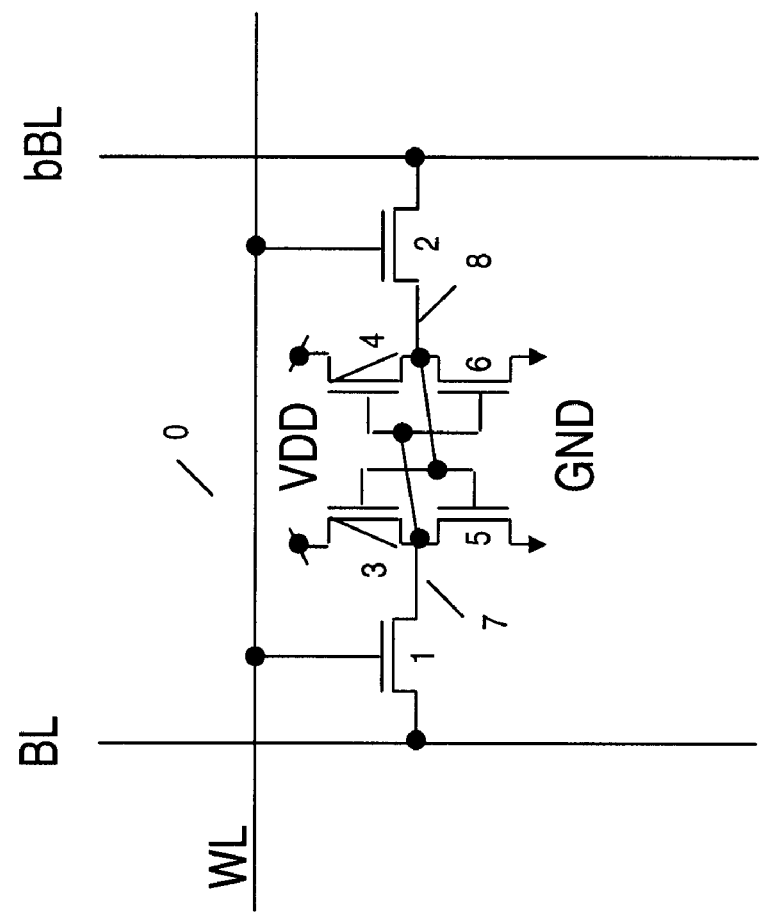
Figures 2A, 2B:
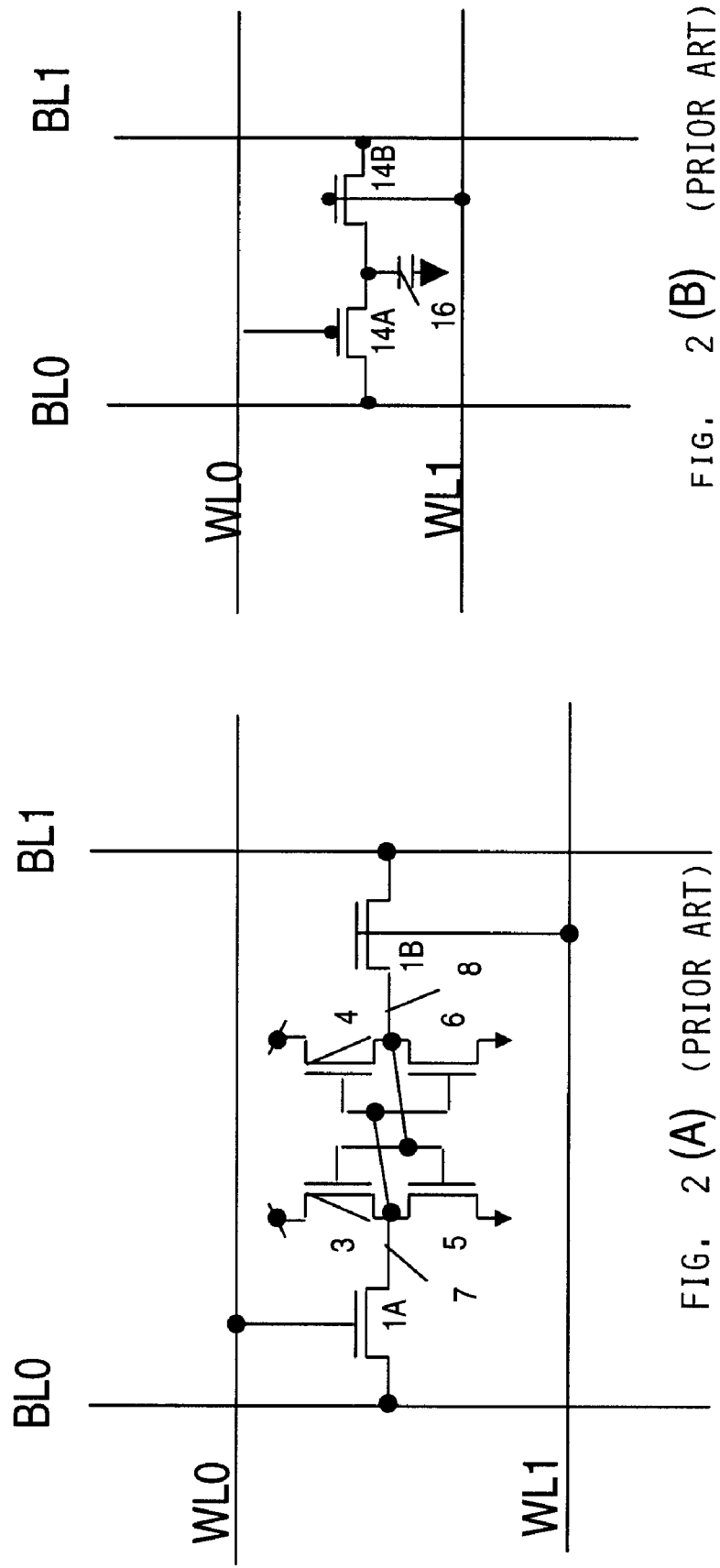
FIGS. 2A and 2B, show a conventional transistor level schematic of a dual-port static memory cell consisting respectively, of four NMOS, two PMOS transistors and two NMOS transistors and one capacitor.
Figure 3B:
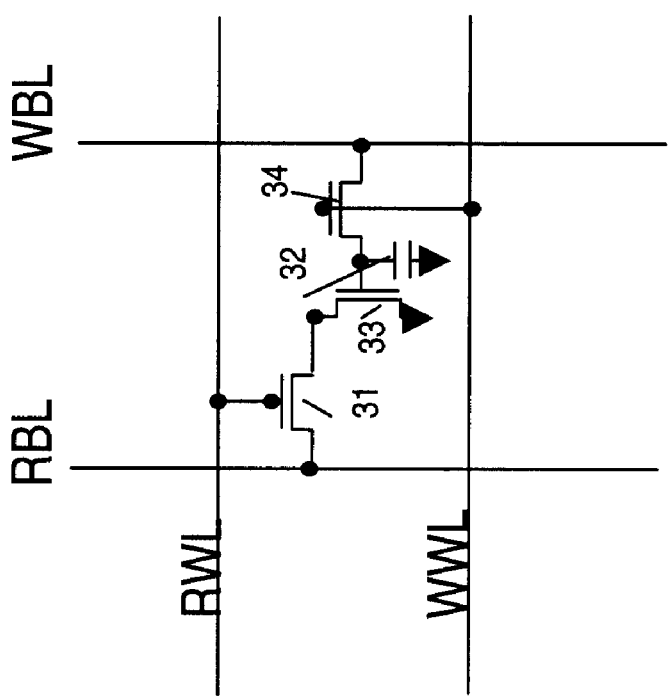
FIG. 3B is a transistor level schematic of a prior art 2T gain cell.
Figure 3A:
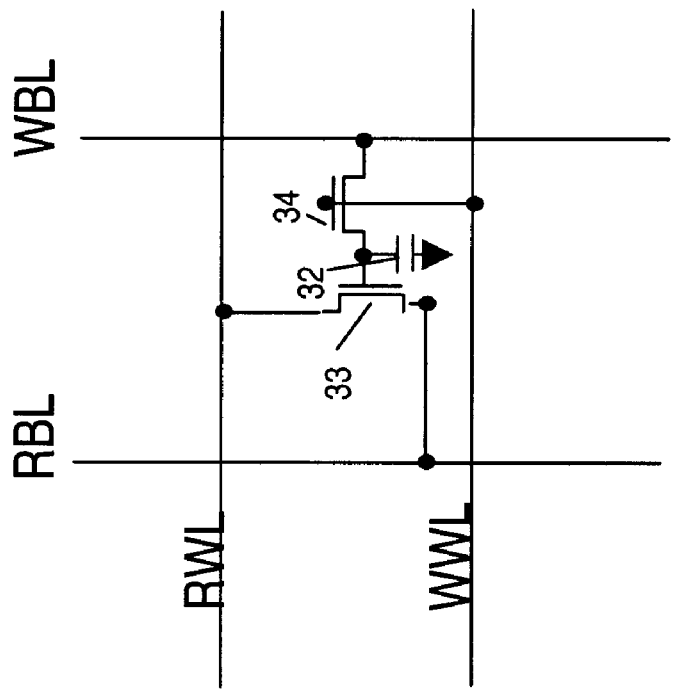
FIG. 3A is a transistor level schematic of a prior art 3T gain cell having two independent ports, wherein the 3T gain cell has one read port and one write port.
Figure 4:
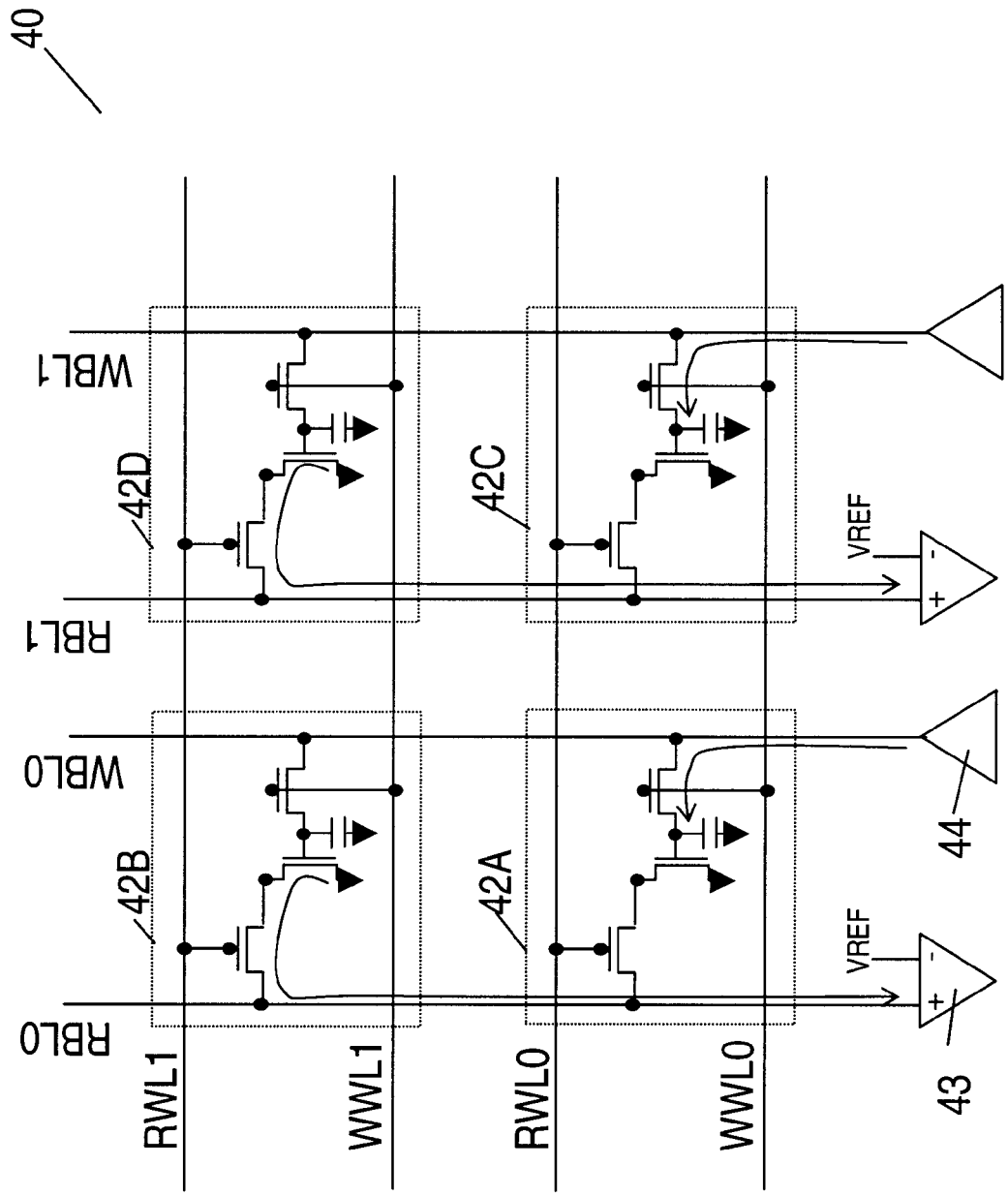
FIG. 4 shows a prior art memory array consisting of 3T gain cells arranged in a matrix formation, which allows a simultaneous read and write operation.
Figure 6:
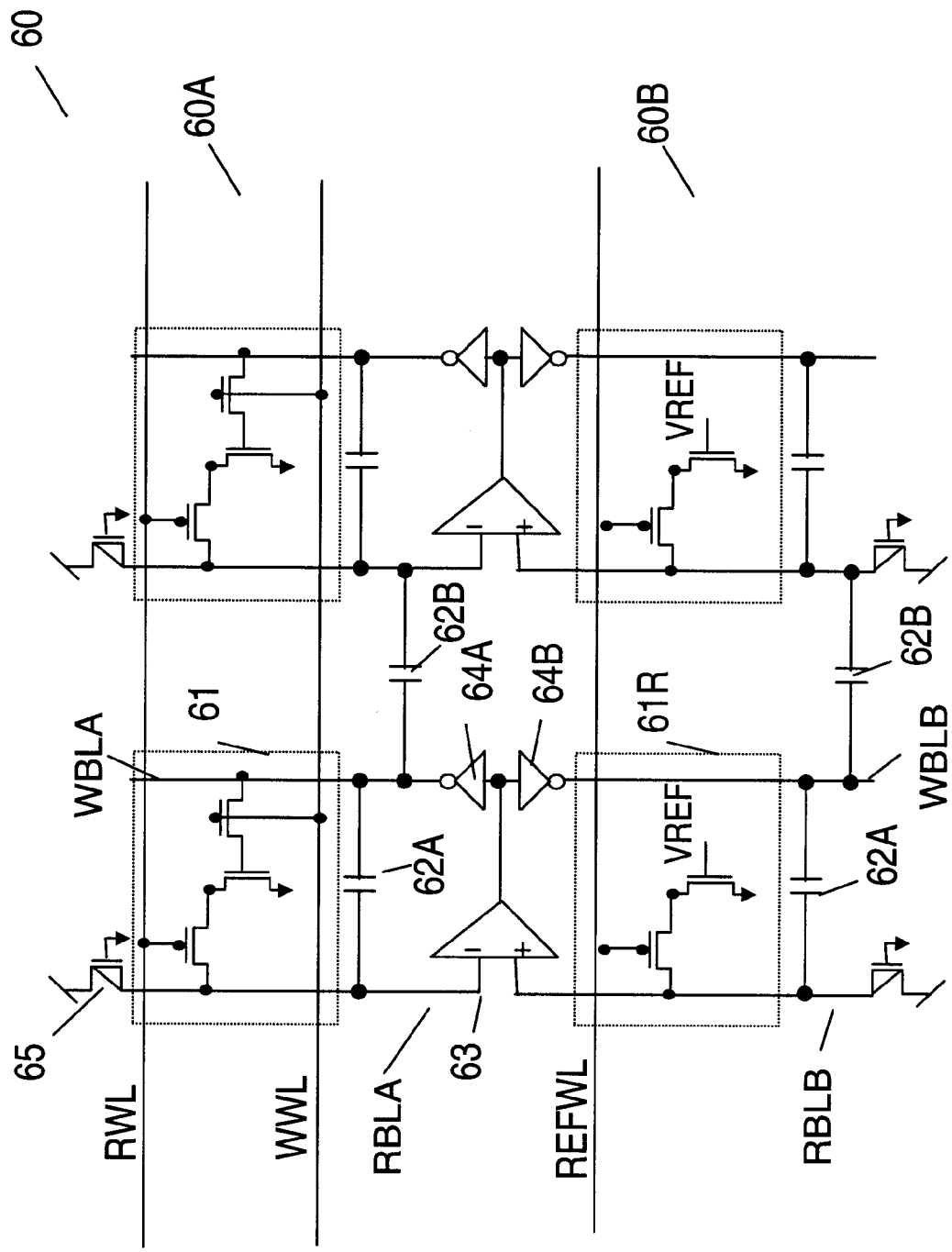
FIG. 6 shows a first embodiment of the present invention that utilizes an open bitline configuration for the read bitline line with a write bitline in identical proximity to both true and complement sections of the read bitline. The memory is shown as being formed by two arrays, each consisting of a plurality of 3T gain cells arranged in a matrix formation.

FIG. 6 shows a first embodiment of the present invention which utilizes an open bitline configuration for the read bitline (RBLA in the array 60A and RBLB in the array 60B). Memory 60 consists of two arrays 60A and 60B, each containing a plurality of 3T gain cells 61 arranged in a matrix formation. Practitioners in the art will realize that other memory cells having two general ports or separate read and write ports may be used to configure the memory array to enable simultaneous read and write operations. Each memory array 60A and 60B includes a reference wordline REFWL that is coupled to reference cells 61R, each coupling to the corresponding RBLs (RBLA in the array 60A and RBLB in the array 60B). Different configurations of the reference cells may be used. For simplicity, REFWL in the array 60A and RWL and WWL in the array 60B are not shown.

When reference cell 61R is accessed, RBL in the activated array discharges to a level or at a rate that is at half-way the value taken by the cell storing a high or a low. Each RBL is coupled to a PMOS load device 65 which remains always on. Alternatively, the PMOS device may be turned off when the read wordline RWL is selected. Additionally, each RBLA and RBLB in the same column of the two arrays 60A and 60B is coupled to a differential sense amplifier 63. Each write bitline WBL in the two arrays is linked to write drivers 64A and 64B, which may be combined to be the same driver. Alternatively, the WBLA and WBLB in the array 60A and B are directly coupled without having the drivers 64A and 64B.

An essential aspect of the invention is the ability of driving WBLs in the two arrays to the same voltage (regardless of with or without drivers 60A and 60B), preferably at the same slew rate. The WBL swing in each array creates coupling noise by the bitline-to-bitline capacitors 62A and 62B. However, for a given sense amplifier and its associated RBLs, this coupling creates an identical coupling noise to RBLA and RBLB that are positioned in the two arrays. This common mode noise is easily rejected by the differential sense amplifier 63. Thus, a read sense amplifier can accurately discriminate between the signal by activating the cell by way of RWL, and the reference cell by way of REFWL.

Figure 7:
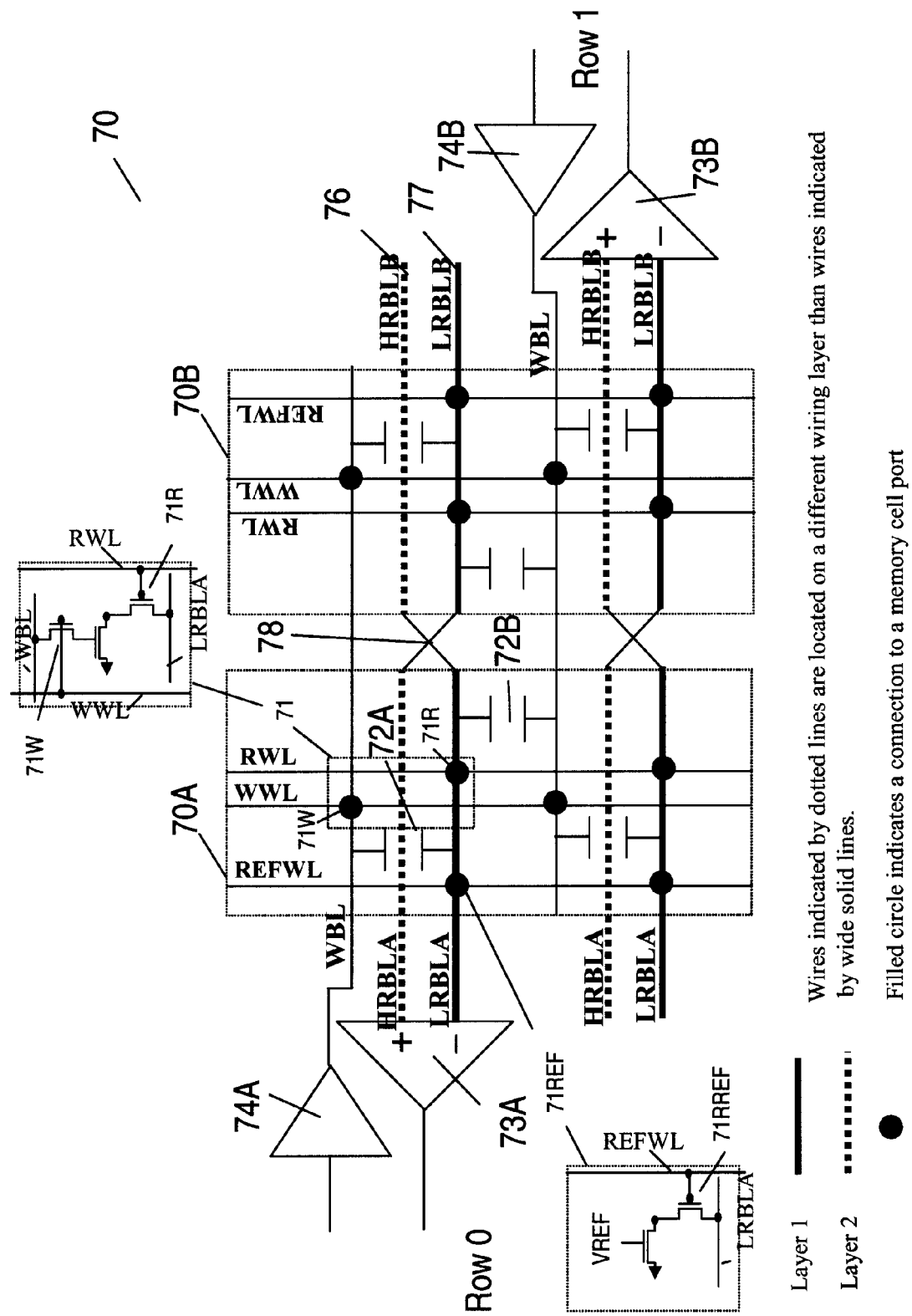
FIG. 7 shows a second embodiment of the present invention illustrating a single memory array to improve the read signal-to-noise ratio during simultaneous read and write operations, wherein the read bitline is arranged in a re-entrant configuration.

FIG. 7 shows a second embodiment of the invention which improves read signal-to-noise ratio during simultaneous read and write operations. This configuration utilizes a re-entrant configuration for each read bitline pair to transform the noise from the write bitline into common mode noise. Unlike the first embodiment, a single memory array is used. The memory array 70 consists of a plurality of 3T gain cells 71 arranged in a matrix formation, where the filled circle indicates a connection to a memory cell port with a read transistor 71R and a write transistor 71W. However, other memory cells having dual ports or a separate read and write port may be used to configure the memory array.

Memory array is further divided into an even number of sections. FIG. 7 illustrates only two sections, however, practitioners in the art will readily realize that a division with any even number of divisions is possible. Alternating sections are depicted as 70A and 70B. Each WBL extends overall memory sections 70A and 70B, and is connected to the write wordline port of all of the memory cells in memory sections 70A and 70B. On the other hand, the read bitline for each column of memory cells is divided into an even number of line segments corresponding to memory sections 70A and 70B. Memory section 70A is shown having read bitline segment LRBLA connected to the read bitline port on the memory cells in the same column of memory array 70A. Also, each memory section 70B has a read bitline segment LRBLB which is connected to the read bitline port on the memory cells in the same column of memory array 70B. Furthermore, each memory section 70A has a re-entrant bitline segment HRBLA for each column of memory cells which, preferably, is on a different interconnect level from LRBLA and which is, thus, not connected to any memory cells. Moreover, memory section 70B is provided with a re-entrant bitline segment HRBLB for each column of memory cells; preferably, on a different interconnect level from LRBLB and which is, therefore, not connected to any memory cells. Typically, HDBLA and HRBLB are arranged over the LRBLA and LRBLB in a different wiring (or interconnect) layer. At each place where array sections 70A and 70B meet, LRBLA and LRBLB are connected to HRBLB and HRBLA, respectively, for each column of cells by way of interconnect 78. More specifically, LRBLA is connected to HRBLB, and LRBLB to HRBLA. Memory cells are coupled directly to LRBLA and LRBLB. This configuration of read bitlines is known as a re-entrant bitline connection.

At least at one place in the array, a row (or rows) of differential sense amplifiers is included so that there exists one sense amplifier for each column of cells. The differential inputs of the sense amplifier are connected to LRBLA and HRBLA, as in 73A, or to LRBLB and HRBLB, as in 73B. This interleaved sense amplifier arrangement shown in FIG. 7 makes it easy to accommodate sense amplifiers 73 in the layout. Optionally, both sense amplifiers 73A and 73B may only be placed in sections 70A or 70B of the array. Write drivers 74A and 74B are connected to the respective WBLs of rows 0 and 1. WBL runs continuously across sections 70A and 70B and remains at the same interconnect level in both sections. Similar to the sense amplifiers, write driver arrangement 74A and 74B are also preferably interleaved. Optionally, both write drivers 74A and 74B may be arranged only in one section A or B without interleaving.

Each memory section 70A and 70B further contains a reference wordline REFWL coupled to reference cells 71REF, wherein the filled circle shown therein indicates a connection to a reference cell port with a read reference transistor 71RREF. A reference cell stores a voltage such that when reference cell is accessed, the read bitline consisting of segments LRBL and HRBL is discharged to a level or at a rate equidistant between the cells storing a high or a low. Each read bitline is coupled to a PMOS load device 65, which remains always on. Alternatively, the PMOS load device may be turned off when a read wordline RWL or REFWL is selected.

In the configuration described herein, when the WBL voltage changes, e.g., during a write operation, noise is coupled into LRBLA, LRBLB, HRBLA and HRBLB. Since LRBLA and LRBLB are of the same length and have the same spatial relationship to WBL, coupling between WBL and LRBLA is nearly identical to the coupling between WBL and LRBLB. Thus, any noise coupled from WBL to read bitlines RBL will be the same for LRBLA and LRBLB. The same applies to HRBLA and HRBLB. Because of the twisting connections 78 between the bitline segments described above, the WBL coupling noise becomes a common mode noise at the input to read sense amplifier 73A and 73B. Common mode noise is easily rejected by the differential amplifier. Thus, the differential signal created by the memory cell and reference cell is easily detected. Generally, a differential amplifier rejects common mode noise. However, large variations in common mode voltage may change the sensing speed of the sense amplifiers resulting in data pattern sensitivity.

Figure 8:
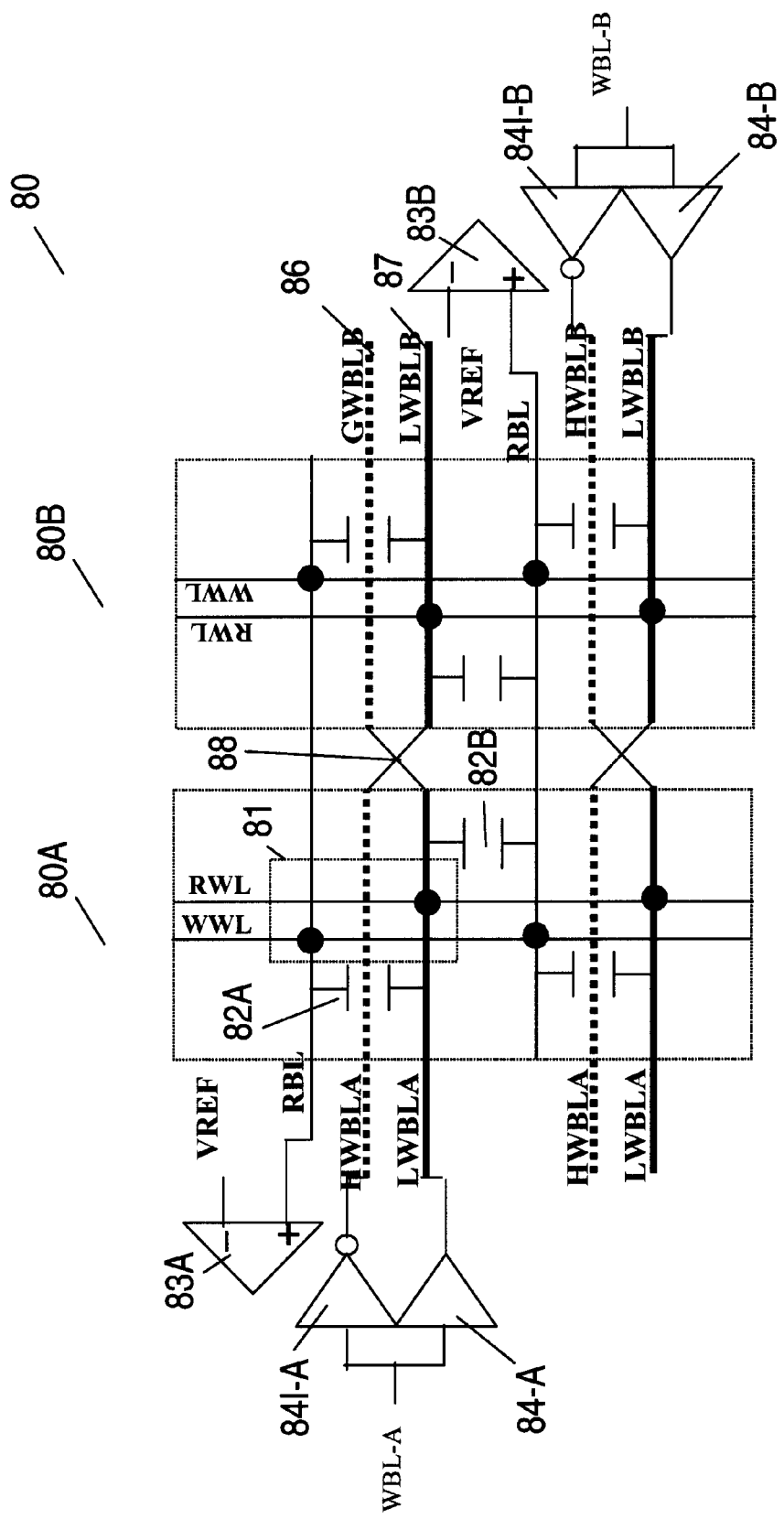
FIG. 8 shows a third embodiment of the invention that enables simultaneous read and write operations, similar to the second embodiment but using only a single memory array. The read bitlines are shown to be arranged as single ended sensing lines and the write bitline is set in a re-entrant configuration.

FIG. 8 shows a third embodiment of the invention enabling simultaneous read and write operations. Similar to the second embodiment, a single memory array is used. The single memory array 80 consists of a plurality of 3T gain cells 81 arranged in a matrix formation, where the filled circle indicates a connection to a memory cell port similar to that shown in FIG. 7. However, other memory cells that have two ports or a read and write port may be used with equal success to configure the memory array. The single memory array 80 is further divided into various memory sections. FIG. 8 illustrates a memory divided in two sections, 80A and 80B. For the more general case that includes more than two sections, all odd sections will have the characteristics of section 80A and all even sections will have the characteristics of section 80B. It is required that the same number of cells present in the even sections be the same as the total number of cells in all odd sections. Unlike the second embodiment, each RBL extends to all memory sections 80A and 80B, and each memory cell in a column is connected to RBL. At least one row of sense amplifiers 83 is included in the array. RBLs are directly coupled to the corresponding sense amplifiers 83.

In contrast to a previous embodiment of the invention, the write bitline for each column of memory cells is divided into a number of segments corresponding to the memory sections 80A and 80B. Each memory section 80A has a write bitline segment LWBLA which is connected to the write bitline port on the memory cells in the same column of memory array 80A. Similarly, each memory section 80B has a write bitline segment LWBLB that is connected to the write bitline port of the memory cells on the same column of memory array 80B. Also, each memory section 80A has a re-entrant write bitline segment HWBLA for each column of memory cells, preferably, on a different interconnect (wiring) level than LWBLA and which is not connected to any memory cells. Additionally, each memory section 80B has a re-entrant write bitline segment HWBLB for each column of memory cells, preferably, on a different interconnect level from LWBLB and which is not connected to any memory cells. Typically, HWBLA and HWBLB are arranged above LWBLA and LWBLB on a different wiring layer. At each place where array sections 80A and 80B meet (e.g., identified by a filled circle at the crossing of two lines), LWBLA and LWBLB are, respectively, connected by way of interconnect 88 to HWBLB and HWBLA for each column of cells. Accordingly, LWBLA is connected to HWBLB and LWBLB to HWBLA. Memory cells are coupled directly to LWBLA and LWBLB. The configuration shown for the write bitline is the aforementioned re-entrant bitline connection.

At least at one place in the array, a row of differential write bitline drivers 84 and 84I is included such that there exists one pair of write bitline drivers for each column of cells. Write bitline drivers 84 and 84I form the pair of drivers, wherein the output of driver 84I is 180° out-of-phase with driver 84. Drivers 84 and 84I are respectively connected to the write bitline segments LWBL and HWBL. Alternately, multiple rows of differential write bitline drivers may be included. An interleaved arrangement showing two rows of write bitline drivers (84-A and 84I-A in the array 80A, and 84-B and 84I-B in the array 80B) is illustrated in FIG. 8.

The interleaved circuit arrangement makes it easy to accommodate the necessary write driver circuitry. Similar to write drivers 84 and 84I, sense amplifiers 83A and 83B may be included in one or more rows of the array. RBL from each column of cells is connected to one terminal of a differential sense amplifier, with the other terminal of each differential sense amplifier connected to reference voltage VREF. Each read bitline. is coupled to a PMOS load device (not shown), which remains always on (as shown in FIG. 5). Alternatively, the PMOS load device may be turned off when a read wordline RWL is selected.

Write drivers 84-A and 84I-A are, respectively, non-inverting and inverting drivers, preferably, having the same slew rate. Since these drivers are provided with the same input WRL-A, sections LWBLA and LWBLB swing in opposite directions with opposing slew rates. In a similar manner, HWBLA and HWBLB will, likewise, swing in opposite directions with opposing slew rates. Since RBL has an identical proximity to both LWBLA and LWBLB, the capacitance between RBL and LWBLA will be nearly identical to the capacitance between RBL and LWBLB. Since the slew on LWBLA is opposite to that on LWBLB, the coupling into RBL cancels, leaving no noise on RBL. Similarly, any contributions from HWBLA and HWBLB cancel. The state of the memory cell accessed with RWL can be sensed by differential sense amplifiers 83A or 83B, wherein one terminal of the differential input is held to the constant reference voltage VREF. Voltage VREF is set to a level corresponding to the levels defined when RBL discharges, when the high data bit is to be read out from the memory cell.

While the invention has been discussed in terms of several preferred embodiments, various alternative and modifications can be devised by those skilled in the art without departing from the invention. Accordingly, the present invention is intended to embrace all such alternatives which fall within the scope of the appended claims.

What is claimed is:

1. A memory array that simultaneously reads and writes different addresses of the same memory array, comprising:
   a plurality of memory cells arranged in two equally sized blocks, each memory cell having a separate read and write port, wherein each port is coupled to a wordline that activates the memory cells, and a bitline that transfers data to or from said memory cells;
   read bitlines and write bitlines respectively connected to a read and write port of each memory cell along a column of each of said blocks;
   read wordlines and write wordlines respectively connected to the read and write ports of each memory cell along a row of each of said blocks;
   a row of differential sense amplifiers located between the two blocks wherein one sense amplifier is provided for each column of said blocks, and wherein each bitline from the first block being respectively attached to a first input terminal of the corresponding differential sense amplifier, and each read bitline from the second block being respectively attached to a second input terminal of the corresponding differential sense amplifier; each write bitline in the first block connecting to the write bitline in the second block in the same column, enabling a simultaneous read and write by activating the read wordline from the first block, the write wordline from either the first or the second block, and the write bitlines traversing both blocks, said arrangement resulting in transforming noise coupling from the write bitline to the read bitlines into common mode noise that is rejected by said differential sense amplifiers, and
   a means for driving a write bitline in said first block and a write bitline in said second block in the same direction to create said common mode noise in a read bitline in said first block and a read bitline in said second block.

2. The memory array of claim 1 wherein a row of reference cells in each of said two blocks is connected to a reference wordline and to said read bitlines, and wherein when said reference wordline is activated, said read bitline coupled to said activated reference cell discharges to a voltage level that is mid-way between the value at which a cell stores a logic 0 and a logic 1, enabling a simultaneous read and write operation by activating said read wordline from said first block, said reference cell wordline from said second block and said write wordline from said first or said second block and said write bitlines traversing both blocks, resulting in an arrangement for transforming the noise coupling said write bitline to said read bitlines into said common noise that is rejected by said differential sense amplifiers.

3. The memory array of claim 1 wherein a write bitline in the first block and in the second array block are respectively driven by a first and second driver having the same slew characteristics, said first and second drivers switching simultaneously.

4. A memory array of memory cells, each cell provided with separate read and write ports, comprising:
   read and write wordlines coupling memory cells along each row of the array, read bitlines and write bitlines coupling cells along each column of the array, and differential read sense amplifiers arranged in a separate row of the array;
   said memory array being divided into two equally sized blocks with each column thereof divided into two segments, and configured with a row of sense amplifiers located above or below the two blocks;
   a read bitline and a write bitline connected to read and write ports respectively of memory cells in each column of each of said blocks, wherein respective read or write bitlines in one of said blocks use the same conductor level as the respective read and write bitline in said second block;
   an additional conductor forming a re-entrant bitline connected to the read bitline in said first block extending across said second block without connecting to cells in said second block for each column, and an additional re-entrant bitline connected to the read bitline in said second block extending across said first block without connecting to cells in said first block for each column;
   a connection from one re-entrant bitline extending from said first block to a terminal of said differential sense amplifier located adjacent to said first block at an edge of said first block opposite to said second block for each column of said array;
   a connection from the read bitline in said first block to a second terminal of said differential amplifier in each column in said array;
   a connection between the write bitline in said first block to the write bitline in said second block for each column in said array,
   wherein the read bitlines and the re-entrant bitlines are placed on separate layers of connectivity, and
   wherein a voltage swing on the write bitline couples an equivalent noise into the read bitline segments connected to the first terminal of said differential amplifier, and the read bitline segment connected to the second terminal of said differential amplifier for each column, transforming the noise into said common mode noise which is rejected by said differential sense amplifiers.

5. The memory array of claim 4 wherein a row of reference cells in each of said two blocks connected to a reference wordline and the read bitlines wherein when the reference wordline is activated, the read bitline coupled to the activated reference cell discharges to a voltage level that is mid-way the value at which a cell stores a logic 0 and a logic 1 enabling simultaneous read and write by activating the read and write wordline from the first block, the reference cell wordline from the second block and the write wordline from either the first or the second block and the write bitlines traversing both blocks, said arrangement resulting in transforming noise coupling from the write bitline to the read bitlines into common mode noise that is rejected by said differential sense amplifiers.

6. The memory array of claim 4 wherein the write bitlines are driven by a row of write bitline drivers located along the periphery of the array.

7. The memory array of claim 4 wherein the write bitlines are driven by a row of write bitline drivers located at both the first and second edges of the array, with a first plurality of write bitlines connected to the first edge drivers and the remaining to the second edge drivers.

8. The memory array of claim 4, wherein each block is divided into an even number of sub-blocks, where each column of each sub-block has a read bitline connected to said memory cells in said sub-block, one write bitline connected to said memory cells of said sub-block and a re-entrant read bitline running across said sub-block without connecting to the memory cells in said sub-block, and wherein bitlines in one sub-block connect to the re-entrant read bitlines of a corresponding column in adjacent sub-blocks.

9. The memory array of claim 4 wherein the write bitlines are on the same layer of connectivity as the read bitlines.

10. The memory array of claim 4 wherein the write bitlines are on the same layer of connectivity as the re-entrant bitlines.

11. The memory array of claim 4 wherein the write bitlines are on a layer of connectivity which is different from either the read bitlines or the re-entrant bitlines.

12. A memory array of dual port memory cells arranged in an array formation comprising:
   memory cells in a row of said array connected to read wordlines and write wordlines, said memory cells along a column being connected by a read bitline;
   an arrangement of differential sense amplifiers having each an input thereof connected to a reference voltage, the read bitline connecting all the memory cells along one column of the array to the second input of corresponding differential sense amplifier;
   a write bitline provided with re-entrant connections, wherein a first segment of a write bitline is connected to half the cells along a column of the array, and a second segment of the write bitline is connected to the remaining cells along the same column of the array;
   a write driver connected to and driving the first write bitline segment, and a second write driver connected to and driving the second write bitline segment; and
   input circuitry linking the write drivers, each driver simultaneously driving from and to opposite state at a given slew rate,
   wherein the re-entrant connections link a write bitline driver to the write bitline in one block, and a second write bitline driver to the write bitline in a second block, such that one-half the cells in each column are coupled to the first driver, and the remaining cells are coupled to the second driver; and wherein the read bitline from one block is connected to the read bitline in the second block and is connected to the input of a sense amplifier for each column and wherein simultaneous read and write operations are realized by activating one read wordline, one write wordline, the sense amplifiers and all the write bitline drivers, wherein the write bitline drivers operate for each column in a way that the output voltage of the first driver is of the same magnitude and 180° out-of-phase from the output voltage of the second driver, and wherein when the voltage on the write bitline changes, no noise is coupled from the write bitlines to the read bitlines.

13. The memory array of claim 12 wherein true and complement write drivers are positioned at opposite ends of the array and the arrangement of differential sense amplifiers is placed at the periphery of said array.

14. The memory array of claim 12, wherein the re-entrant connections are positioned in a connecting layer that coincides with that of the read bitlines.

15. The memory array of claim 12, wherein the write bitline connections are positioned in a connecting layer that coincides with that of the read bitlines.

16. The memory array of claim 12, wherein the read bitlines connections are positioned in a connecting layer that differs from that of the re-entrant or write bitlines.

17. The memory array of claim 12, wherein a plurality of pairs of true and complement write drivers are located on one side of said array, and the remaining pairs of true and complement drivers are located on a second side of said array.

18. The memory array of claim 12 wherein each block is divided into an even number of sub-blocks, where each column of each sub-block has one read bitline connected to said memory cells in said sub-block, one write bitline connected to said memory cells of said sub-block and a re-entrant write bitline running across said sub-block without connecting to the memory cells in said sub-block; and wherein write bitlines in one sub-block connect to the re-entrant write bitlines of a corresponding column in adjacent sub-blocks.

* * * * *